United States Patent [19]

Smith

[11] Patent Number: 4,646,275

[45] Date of Patent: Feb. 24, 1987

[54] DYNAMIC RANGE COMPRESSION FOR VARIABLE AREA OR WIGGLE TRACE DISPLAY METHOD AND APPARATUS

[75] Inventor: Kenneth R. Smith, Milpitas, Calif.

[73] Assignee: Geometrics, Inc., Sunnyvale, Calif.

[21] Appl. No.: 618,988

[22] Filed: Jun. 11, 1984

[51] Int. Cl.$^4$ .......................... G01V 1/00; H03G 3/00
[52] U.S. Cl. ........................................ 367/67; 367/65; 330/254
[58] Field of Search ........................ 367/30, 34, 65, 67, 367/73, 98; 330/51, 279, 129, 254; 364/575, 578, 734; 455/245, 250; 343/7 A, 6

[56] References Cited

U.S. PATENT DOCUMENTS 3,394,315 7/1968 Gray ..................................... 455/239
4,546,326 10/1985 Van Uffelen et al. ............... 330/129

Primary Examiner—Thomas H. Tarcza
Assistant Examiner—Daniel T. Pihulic
Attorney, Agent, or Firm—Robert P. Cogan

[57] ABSTRACT

In a system for providing maximum display deflection within a preselected scale size for a time-varying imput whose envelope may be monotonically decreasing, or otherwise varying, automatic gain control means produces a multiplication factor by which an input signal is multiplied to provide an output signal for provision to utilization means such as a display. The multiplier signal is produced as a function of an error signal. The output signal is compared to a value indicative of a desired trace size to produce a signal representative of percentage error rather than a difference. The percentage error is subtracted from 100% to provide a gain error signal, a function of which is the multiplier signal. The function may be further generated by sampling the gain error signal over a window length and summing the samples. The integral thus obtained may be utilized as an exponent in the value of the multiplication factor.

8 Claims, 3 Drawing Figures

DYNAMIC RANGE COMPRESSION FOR VARIABLE AREA OR WIGGLE TRACE DISPLAY METHOD AND APPARATUS

BACKGROUND OF THE INVENTION

The present invention relates to automatic gain control circuits suitable for providing data which may be displayed in maximizing deflection within a scale while maintaining waveform shape adaptable for use with the system for providing a display indicative of analog display of a time varying signal with a time varying envelope such as a seismic recording system.

In seismic recording systems, it is desirable to provide displays of a plurality of traces in time registration, each trace being indicative of the currents of a signal received from a sensor. Each sensor signal is time varying and may commonly have a monotonically decreasing envelope. In order to maximize visibility of the information to be determined from the sample, it is desirable to provide for an automatic gain control in which scale deflection within a chosen maximum trace size for each sample is maximized while preserving the time varying shape of the waveform. A plurality of traces are viewed simultaneously to give an operator an indication of geological anaomalies.

Either wiggle traces or variable area traces may be viewed. In the generation of wiggle traces, the analog trace is displayed directly. In variable area traces, the apparatus includes means employing an algorithm for shading in areas beneath positive excursions of the analog level and a zero level to enhance visibility of the waveform.

Many different automatic gain control prior art embodiments have been provided. However, their ability to portray the input signals optimally (in terms of the above-described criteria) is limited either in terms of ability to match gain control signals to behaviour of the signal or in terms of complexity of the circuit providing suboptimal response time to accommodate time variations of input signal.

SUMMARY OF THE INVENTION

It is therefore an object of the present invention to provide a method and apparatus for enhancing viewability of wiggle trace or variable area scans in which the gain control factor is selected on the basis of a proportion of an output trace level to a desired trace size.

It is also an object of the present invention to provide in a display apparatus a method for varying the gain applied to a time varying signal to maximize display magnitude with respect to a preselected display size while preserving time varying wave shape.

It is a further object of the present invention to provide a method and apparatus of the type described in which sensitivity of response is selectable by selecting a time during which an error signal is reviewed.

It is the further specific object of the present invention to provide a method and apparatus of the type described in which a function is applied to the error signal to comprise a multiplier signal by which the input data is displayed to provide an output value for display.

Briefly stated, in accordance with the present invention, a gain control method and apparatus are provided in a system for providing maximum display deflection within a preselected scale size for a time-varying input whose envelope may be monotonically decreasing, or otherwise varying to produce a multiplication factor by which an input signal is multiplied to provide an output signal for provision to utilization means such as a display. The multipler signal is produced as a function of an error signal. The output signal is compared to a value indicative of a desired trace size to produce a signal representative of percentage error rather than a difference. The percentage error is substracted from 100% to provide a gain error signal, a function of which is the multiplier signal. The function may be further generated by sampling the gain error signal over a window length and summing the samples. The integral thus obtained may be utilized as an exponent in the value of the multiplication factor.

BRIEF DESCRIPTION OF THE DRAWINGS

The means by which the foregoing objects and features of invention are achieved are pointed out with particularity in the claims forming the concluding portion of the specification. The invention, both as to its organization and manner of operation, may be further understood by reference to the following description taken in connection with the following drawings.

Of the drawings.

DESCRIPTION OF THE PREFERRED EMBODIMENTS

Figure 1:
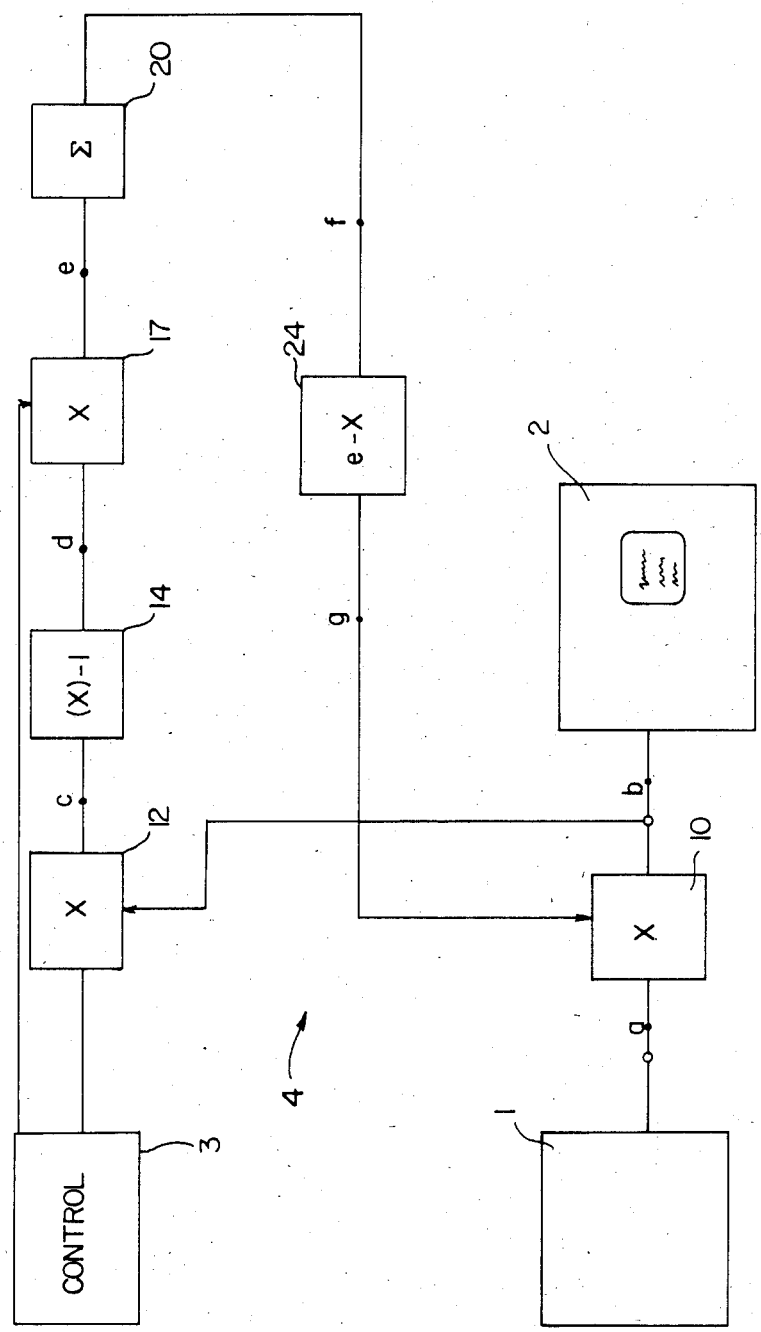
FIG. 1 is an illustration in block diagramatic form of a system for varying gain applied to an input signal to provide an output which may be coupled for display.

FIG. 1 illustrates in block diagramatic form a means for receiving input signals containing time varying information whose relative time occurrence and waveform shape is of interest and in which it is desired to maximize the size of the trace within the limits of a specific waveform size, such as may correspond to a particular scale factor while maintaining the wave shape. An example of such an apparatus is a reflection seismograph. The apparatus in FIG. 1 is discussed in the context of reflection seismograph but may be otherwise utilized in accordance with the teachings herein.

In the apparatus of FIG. 1, input data is provided from input data means 1 which produces signals bearing intelligence for review by utilization means. The intelligence may comprise a plurality of analog reflection signals each of which is coupled for provision of a time varying amplitude display. In the present embodiment, the input data provided is representative of seismic sensor outputs which has been processed and convereted into floating point digitized form in which a plurality of bits are provided indicative of a mantissa and a further plurality of bits indicate an exponent of a value of a signal. The signals are translated for utilization to output data means 2. Commonly the output data means 2 comprises prior art digital-to-analog conversion circuits, video drive circuits and CRT display means. The CRT display means included in the data section 2 may provide for a provide of traces having a common time abscissa. A maximum height for each trace may be selected. For simplicity in description, the misnomer "trace size" will be utilized as a device for the sake of brevity. Trace size refers to a desired short term average of the absolute value of the displayed trace on the output device. A prior art control means 3 is provided for selecting all known functions for the reflection seismograph and includes provision of a signal indicative of desired trace size. Dynamic range control, or automatic range control is provided by the automatic gain control means 4.

In the illustration of FIG. 1, a number of terminals are noted by lower case letters. These do not illustrate actual terminals, but rather are reference points to correspond to the point at which appear the signals illustrated in the correspondingly denoted sections of FIG. 3. The input data is coupled to a multiplier circuit 10 providing the output connected for utilization as described above. It is desired to control the average of the absolute value of the output so as to make it equal to the desired trace size. Therefore, the output signal from the multiplier circuit 10 is provided to a first input of a multiplier 12 for comparison to a signal having the value representative of the reciprocal of desired trace size. This signal is connected to the multiplier circuit 12 from the control circuit 3. The multiplier circuit 12 produces an output indicative of the output signal divided by the desired trace size. In accordance with the present invention, a percentage error signal is provided representative of a proportion, namely the percentage of output level obtained with respect to the desired trace size. In the preferred embodiment, discrete digital values are processed.

The percentage error signal is compared to 100 percent to provide a level signal which will be denominated the gain error signal. The gain error signal is generated in a subtractor 14 which receives the percentage error signal, takes the absolute value thereof and substracts it from one. In most operating instances, the gain error signal is less than zero. However, the further-described functions of the present circuit follow through when the gain error signal is zero or positive as well. The gain error signal is multiplied by a constant in a multiplier circuit 17 having an input connected to the output of the substractor circuit 14. The constant may be provided from the control circuit 3 and is selected to be indicative of the reciprocal of an automatic gain control window length. In selecting the window, a length is selected to avoid loss of resolution of short term amplitude changes while providing for responsiveness. In the example of a seismic signal having a return characterizable as having a nominal 100 Hz input, a window length of 100 to 200 miliseconds may be selected to capture 10 to 20 cycles. The output of the multiplier circuit 17 is connected to a summing circuit 20 to provide an output that may be referred to as a filtered gain error.

The output of the summing circuit 20 is connected to a gain function circuit 24 to provide a programmed gain function as a function of the filtered gain error. The programmed gain function is selected to be useful with respect to expected characteristics of the input information. In the case of a reflection seismograph, as time increases, the envelope of the return signal decreases substantially exponentially. The function circuit 24 in the present embodiment is selected to be the constant e to the power of minus x, where x is the filtered gain error. The function circuit 24 provides a multiplier input to the multiplier circuit and to multiply the input thereto and provide the gain controlled output.

The circuit of FIG. 1 may be embodied by readily available components whose particular pin connections to achieve desired selections are described in their commercially available reference manuals. Each of the above-described multiplier circuits 12, 17 and 24, for example, may be embodied by a 74LS384 chip. The summing circuit 20 may also be embodied by a 74LS384 using any input pin normally used for addition of partial products to achieve the above-described adding function. The program function circuit 24 may comprise a programmable read only memory. In the specific instance of providing an output value indicative of the constant e raised to a power, a lookup table circuit is commonly utilized. Similarly, the multiplier circuit 10 may be readily constructed with available circuitry, and a preferred form is illustrated in Figure 2.

Figure 2:
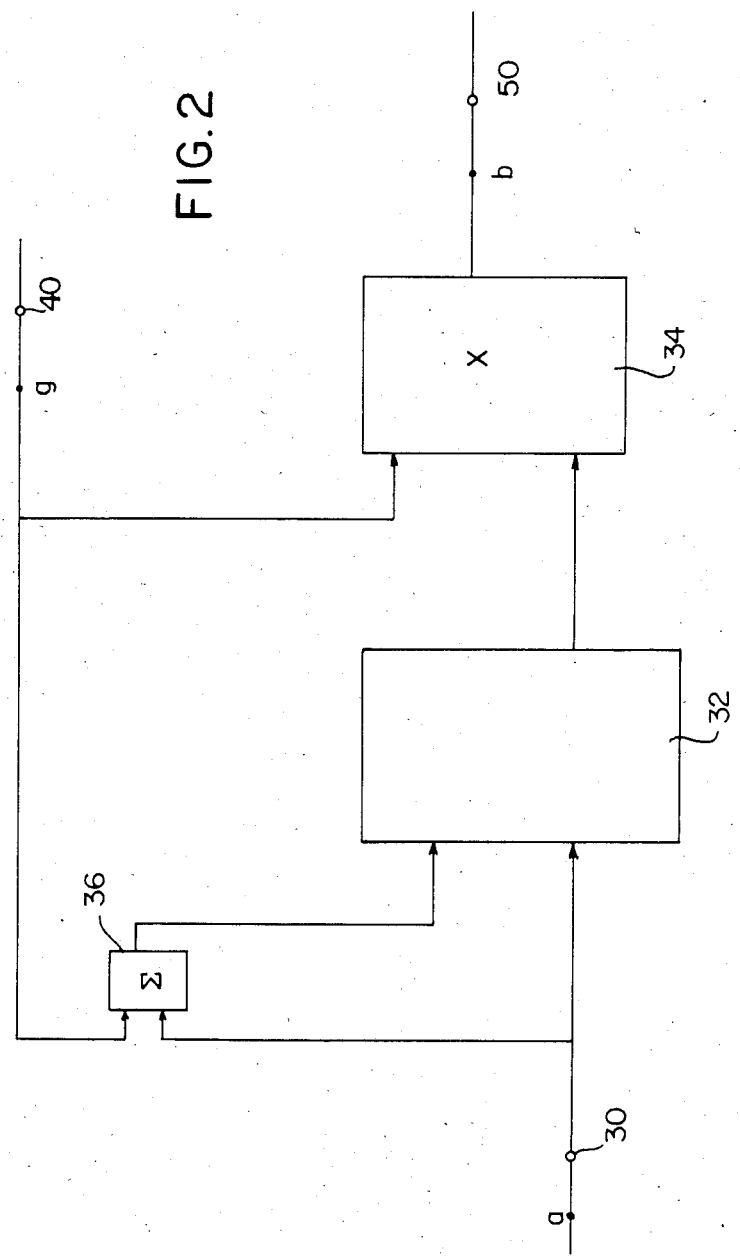
FIG. 2 is an illustration in block diagramatic form of an embodiment of the signal multiplier means illustrated in FIG. 1.

FIG. 2 is a block diagramatic representation in which the input to the multiplier 10 is represented by a terminal 30. The terminal 30 in fact represents a well-known bus structure providing a mantissa signal to a shifter PROM 32 having an output connected to a multiplier circuit 34. The exponent portion of the input signal is connected to a summing circuit 36. The gain control signal also has a mantissa and an exponent component and is represented as being received at a terminal 40 which in fact represents a well-known bus structure. The exponent of the gain control signal is connected to another input of the summing circuit circuit 36 and the mantissa is connected to another input of the multiplier circuit 34. Multiplication of the input signal by the gain control signal proceeds in the normal fashion. In order to perform the normal multiplication function, exponents are added at the summing 36 and an output thereof is connected to the shifter from 32. Multiplication in the conventional digital fashion is achieved by shifting positions of the significant digits of the digital number representing the mantissa at the input terminal 30. The output thereof is delivered to the circuit 34 where multiplication of the mantissa component of the gain control signal by the thus multiplied input signal proceeds in a conventional manner to provide an output at a terminal 50 which represents the conventional bus structure. Again, the multiplier circuit 34 may be comprised of a 74LS384.

Figure 3:
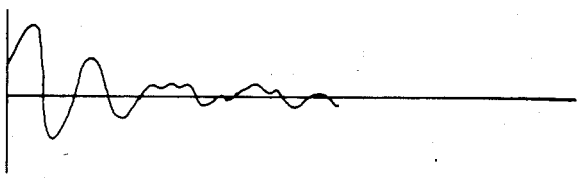
FIG. 3 is a waveform chart useful in understanding the operation of the apparatus of FIG. 1.
Figure 3:
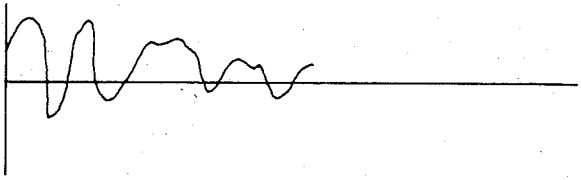
Figure 3:
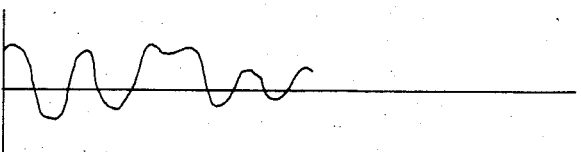
Figure 3:
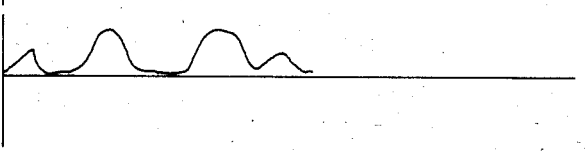
Figure 3:
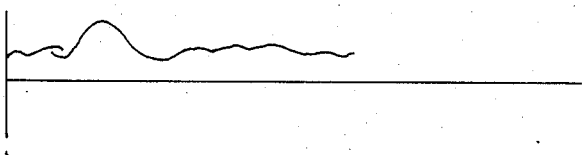

In operation, operation proceeds as described with respect to FIG. 3 in which the abscissa is timed and the ordinate for each plot within FIG. 3 is amplitude on an arbitrarily selected scale. In the description of Figure 3, relative wave shapes rather than relative amplitudes from plot to plot are of greatest significance.

Figure 3F:
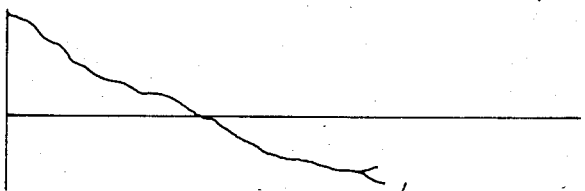
Figure 3G:
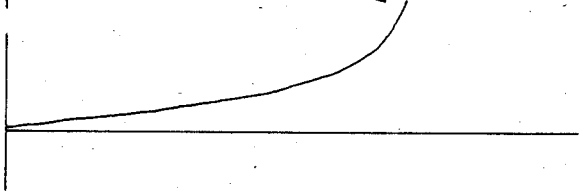

FIG. 3a represents input signal at the terminal denoted a; FIG. 3b represents an output signal which may be translated for display as indicated at terminal b at the output of the multiplier 10; FIG. 3c represents the output of the multiplier 12 indicative of the percent error signal; FIG. 3d represents the gain error signal produced at the output of the subtractor 14 and appearing at point d; FIG. 3e represents the output of the multiplier circuit 17; FIG. 3f is indicative of the output of the summing circuit 20; and FIG. 3g represents the value of the gain control signal to be provided from the programmed gain function circuit 24. It must be realized that due to the standard limitations of graphic representation, the illustrations in FIG. 3 may not be thoroughly rigorous, and the description of FIG. 1 is controlling.

In operation, an input in signal received at point a is multiplied and provided for further translation at point b as illustrated in FIGS. 3a and 3b respectively. The output (FIG. 3b) is compared to the so-called trace size signal. The comparison indication appearing at point c and illustrated in FIG. 3c will also comprise a time varying wave since the input is varying. Instantaneous differences between the instantaneous output value and 100 percent of the trace size are seen at point d (FIG. 3d). Of course, it is necessary to derive a time varying wave since in the case of a time varying input, the output will not level off at 100 percent of the trace size. If this were the case, the wave shape of the signal will have been destroyed. Therefore it is generally desirable that a gain error signal in fact be provided at point d. The multiplier 17 establishes a window and provides an output as illustrated in FIG. 3e for summation by the summer 20. If the trace is generally filling the available trace size, the value at the output 20 will be low. Therefore the filter gain error will not change. With a constant as an exponent, the program gain function would provide a constant gain to the multiplier circuit 10. This is indicative of the condition in which full trace size is being obtained and indeed whatever multiplication factor is present already in the multiplier circuit 10 should be indeed multiplied by unity. As the input signal decays, as seen toward the right in FIG. 1, the value of the output of the multiplier 10 will tend to decrease. Consequently, the gain error signal (FIG. 3d) will tend to increase. Consequently, the output of the summing 30 will tend to have an increasing negative value. Since the function circuit 24 provides an e to minus x function, the value of the multiplier provided at the output of the function circuit 24 increased (FIG. 3g) to further multiply the signal in the multiplier 10 and force the output to approach the full magnitude of selected desired trace size.

Scale deflection is maximized as well as responsiveness of the display to variations.

What is claimed as new and desired to be secured by Letters Patent of the United States is:

1. Automatic gain control means for maximizing scale deflection within a preselected maximum trace size produced by utilization means in response to a time-varying input signal while preserving the time-varying shape of the input signal, said automatic gain control means comprising: means for producing a signal indicative of the preselected trace size, sampling means for sampling the input signal and providing a sample thereof, means for producing a proportion signal comprising means for producing a signal indicative of the proportion of the sample to the preselected trace size, means providing a gain error signal comprising means for producing a signal indicative of the difference between the proportion signal and a selected constant level, and means for providing an automatic gain control signal as a function of the gain error signal.

2. An automatic gain control according to claim 1 wherein said means for providing an automatic gain control signal comprises means for raising to a power a value of the gain error signal.

3. Automatic gain control apparatus according to claim 2 wherein said means for producing said gain error signal comprises means for selecting a period of integration of said difference between the proportion signal and the selected constant level.

4. In a reflection seismograph, an automatic gain control system comprising means for receiving an input signal from data acquisition means and providing an output signal for translation to display means comprising a first multiplier circuit for receiving an input representative of a selected trace size and another input indicative of a sample value of the input signal, said first multiplier circuit for providing an output indicative of the proportion of the input signal sample to the selected trace size, a subtractor circuit for providing a difference signal indicative of the difference between said proportion and a selected value, sampling means connected to the output of said subtracting means for establishing a sampling period, means coupled to the output of said sampling means for establishing a summed total over the sampling period, function generator means coupled to the output of said summing means for providing a preselected function of the output of said summing means, the output of said function generator means being connected to provide a multiplier by which the input signal is multiplied to provide the output signal.

5. A reflection seismograph according to claim 4 wherein said function generator means comprises an exponent circuit for generating a signal having a value indicative of a constant raised to the power of an exponent and said output of said summing means is connected to comprise the exponent.

6. A method for maximizing trace height within a preselected scale while maintaining time-varying wave form shape of a trace, said method comprising comparing an input signal to be translated for display to a value indicative of a desired trace size to provide an indication of the proportion therebetween, producing an error signal indicative of the difference between the proportion and a selection level, and producing a gain error signal as a multiple of the error signal and deriving an automatic gain control value as a function of the multiple.

7. The method according to claim 6 wherein the step of deriving a function comprises deriving an exponential value.

8. The method according to claim 7 wherein the step of producing a multiple comprises establishing a window period for sampling the difference and summing to produce the gain error signal over a sampling period.

* * * * *